United States Patent
Colgan et al.

(10) Patent No.: US 7,193,318 B2
(45) Date of Patent: Mar. 20, 2007

(54) MULTIPLE POWER DENSITY CHIP STRUCTURE

(75) Inventors: Evan G. Colgan, Chestnut Ridge, NY (US); George A. Katopis, Poughkeepsie, NY (US); Chandrashekhar Ramaswamy, Chandler, AZ (US); Herbert I. Stoller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/711,023

(22) Filed: Aug. 18, 2004

(65) Prior Publication Data

US 2006/0038281 A1 Feb. 23, 2006

(51) Int. Cl.
*H01L 23/495* (2006.01)

(52) U.S. Cl. ............... 257/713; 257/712; 257/E23.051; 257/E23.111

(58) Field of Classification Search ........ 257/712, 257/713, 717, E23.051, E23.101, E23.102, 257/E23.11, E23.111, E23.113
See application file for complete search history.

(56) References Cited

U.S. PATENT DOCUMENTS

| | | | |
|---|---|---|---|
| 4,498,530 A | 2/1985 | Lipschutz | |
| 4,975,659 A | 12/1990 | Butler et al. | |
| 5,098,604 A * | 3/1992 | Brouard et al. | 516/45 |
| 5,098,609 A * | 3/1992 | Iruvanti et al. | 252/511 |
| 5,250,843 A | 10/1993 | Eichelberger | |
| 5,587,882 A | 12/1996 | Patel | |
| 5,623,394 A | 4/1997 | Sherif et al. | |
| 5,757,620 A | 5/1998 | Edwards et al. | |
| 6,168,970 B1 | 1/2001 | Burns | |
| 6,292,369 B1 * | 9/2001 | Daves et al. | 361/719 |
| 6,437,990 B1 | 8/2002 | Degani et al. | |
| 6,480,672 B1 * | 11/2002 | Rosenzweig et al. | 392/365 |
| 6,506,681 B2 | 1/2003 | Grigg et al. | |
| 6,558,978 B1 | 5/2003 | McCormick | |
| 6,850,411 B1 * | 2/2005 | Patel | 361/704 |
| 2003/0015788 A1 | 1/2003 | Pogge et al. | |
| 2003/0082847 A1 | 5/2003 | Turner et al. | |
| 2003/0127715 A1 | 7/2003 | Liu et al. | |
| 2003/0197252 A1 | 10/2003 | Budelman | |

FOREIGN PATENT DOCUMENTS

JP 2004-172489 * 6/2004 .............. 23/36

* cited by examiner

*Primary Examiner*—Evan Pert
*Assistant Examiner*—Victor A. Mandala, Jr.
(74) *Attorney, Agent, or Firm*—Todd M. C. Li; James J. Cioffi

(57) ABSTRACT

A multiple power density packaging structure with two or more semiconductor chips on a common wiring substrate having a common thermal spreader with a planar surface in thermal contact with the non-active surfaces of the chips. The semiconductor chips have different cooling requirements and some of the chips are thinned to insure that the chips requiring the lowest thermal resistance has the thinnest layer of a thermal adhesive or metal or solder interface between the chip and thermal spreader.

13 Claims, 3 Drawing Sheets

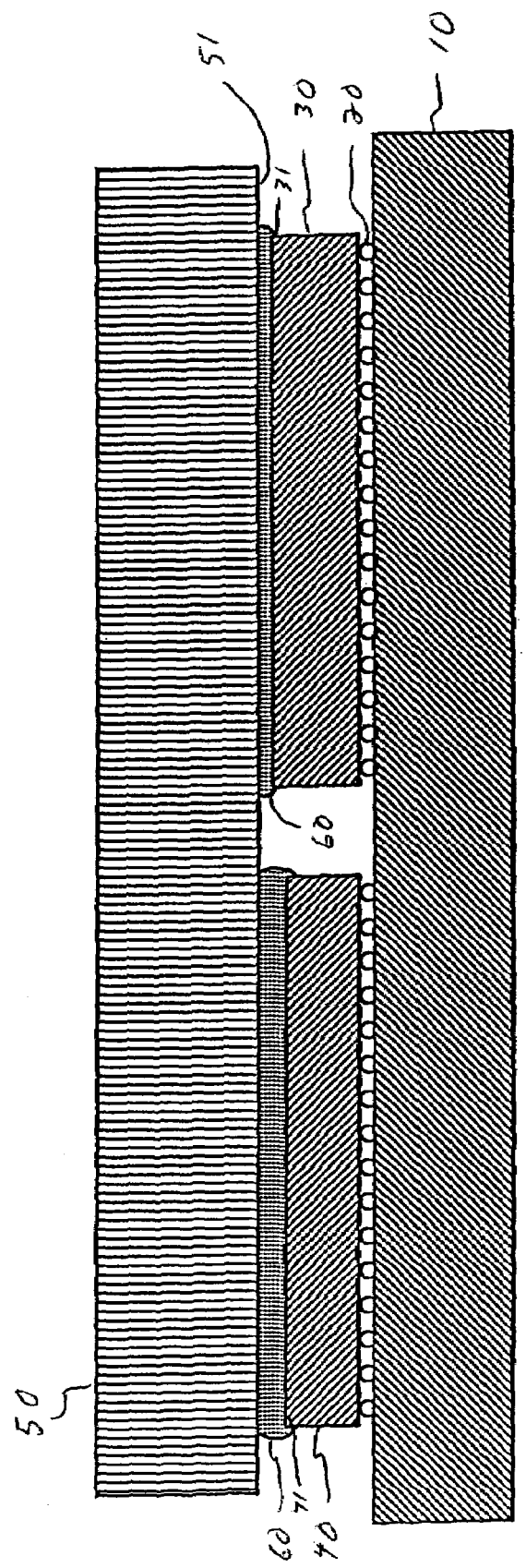

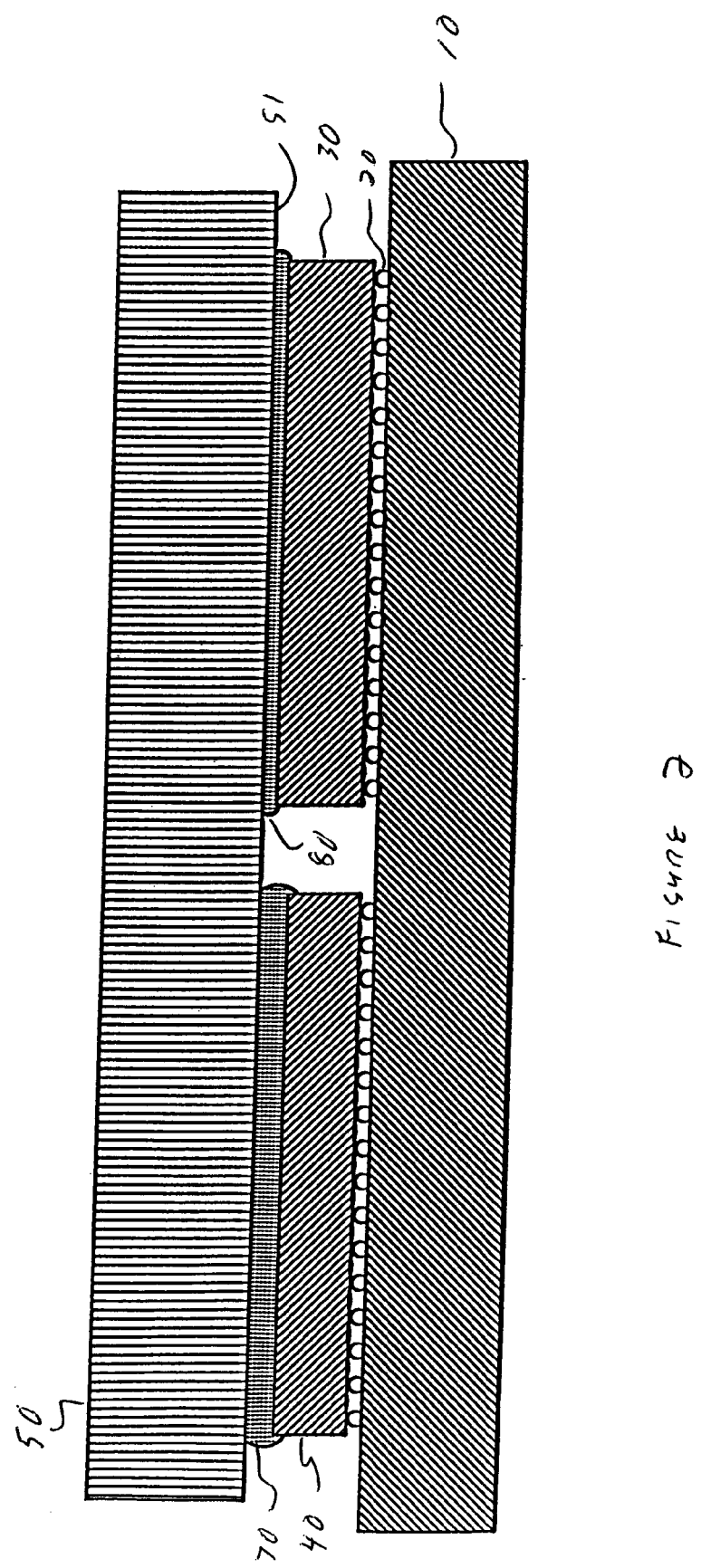

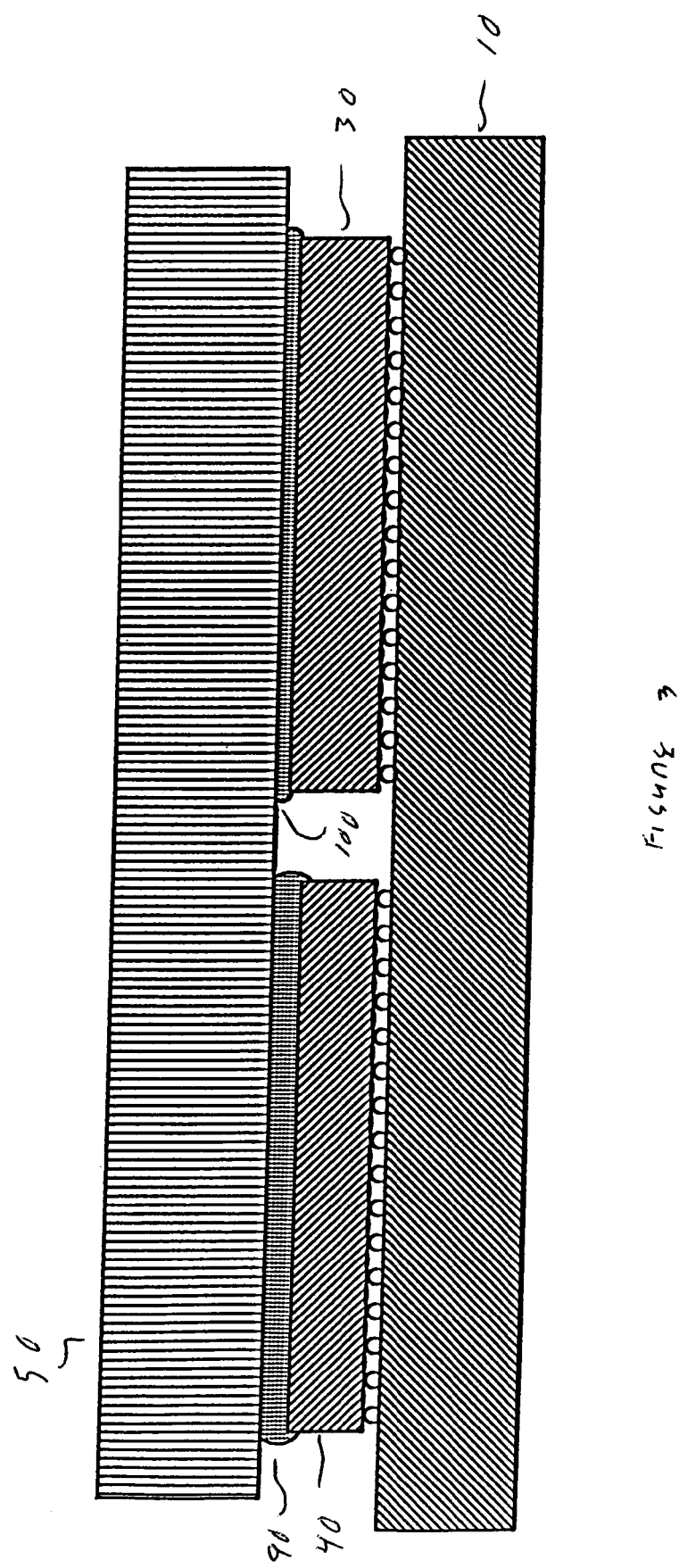

MULTIPLE POWER DENSITY CHIP STRUCTURE

BACKGROUND OF INVENTION

The present invention relates to the cooling of integrated circuit (IC) packaging structures. More particularly the present invention is directed to the cooling of multiple chips, or ICs, using a common heat spreader or lid structure where the chips have different cooling requirements.

As heat is generated during the functioning of integrated circuit chips (ICs), the thermal resistance to the heat sink must be small so that the operating temperature of the chip is low enough to assure the continued reliable operation of the device. The problem of heat removal becomes more difficult as chip geometries are scaled down and operating speeds are increased, resulting in increased power density. The ability to adequately cool the chips can therefore be a limiting factor in the further increase of system performance. Integrated circuit chips mounted face down on wiring substrates, and particularly multiple chips on a common substrate such as is found in a multichip module (MCM), present special cooling difficulties. In an MCM, the chips may be mounted very close together and nearly cover the whole top surface of the MCM wiring substrate.

Additionally, the chips may have different cooling requirements. For example, a processor chip may have a higher power density (W/cm$^2$) than a memory chip mounted on the same wiring substrate, or first level package. Further, the maximum allowed device junction temperature may be different for different chips mounted to the same wiring substrate. An additional problem is that processor chips, and other chips, frequently have a "hot spot" which can have a heat flux (W/cm$^2$) significantly greater than the average heat flux resulting in temperatures approximately 20° C. hotter than the average chip temperature. A thermal solution which may be adequate for the average chip power density may not be adequate to allow reliable operation of the hot spot region of the chip.

A common technique for reducing the thermal resistance from a high-power IC to a heat sink, or cooling plate, is to add an intermediate heat spreader between the chip and the heat sink, or cooling plate, to reduce the power density (W/cm$^2$) which passes through the layer of compliant thermally conductive material. The addition of a heat spreader can be advantageous because the complaint thermally conductive material layer is usually a significant fraction of the total thermal resistance. Generally, due to the difference in thermal expansion between the chip and the material of the cooling plate or heat sink, which is typically copper or aluminum, a compliant thermally conductive material is required between the chip and the heat sink or cooling plate.

Silicon has a linear thermal coefficient of expansion (TCE) of about 2.5 ppm/° C., copper has a linear thermal coefficient of expansion of about 16.5 ppm/° C. and aluminum has a linear thermal coefficient of expansion of about 23 ppm/° C. The heat sink, or cooling plate, will conduct heat away from the IC chip(s) and the heat is removed from the cooling plate or heat sink by methods such as forced air cooling or circulating liquid coolants. Compliant thermally conductive materials are typically thermal pastes, or thermal greases and are frequently referred to as thermal interface materials, or TIMs. The total thermal resistance between the chip and heat sink or cooling plate can usually be reduced by rigidly bonding to the back surface of the chip a heat spreader. The heat spreader is composed of a material with a coefficient of thermal expansion close to that of Si, and with a high thermal conductivity.

Suitable materials for such heat spreaders include diamond (TCE of about 2.8 ppm/° C.), composites of Si and SiC, referred to as SiSiC, SiC (TCE of about 4 ppm/° C.), Mo, and various ceramic materials, where diamond or a SiSiC composite are most suitable. Suitable materials also include composite materials containing, Si or SiC or diamond or ceramic particles such as copper filled with SiC particles. Due to the close thermal expansion match, a rigid bond with a thermal adhesive or solder can be used and a compliant layer is not needed. A heat sink is than mounted onto the thermal spreader using a layer of a compliant thermally conductive material. Note that in some packaging structures, the lid, or package cap, can also serve as a heat spreader. With rigid thermal bonding methods, using thermal adhesives such as silver filled epoxy, or other filled polymers, or solders, a lower thermal resistance join can be formed than with TIMs.

With a thermal adhesive such as a silver filled epoxy or filled polymer, a typical bond thickness is about 12 microns, and may range from 6 to 12 microns and will be reduced to around 5 microns in the future. With solders, or metal layers, used for thermally joining a chip to a thermal spreader, a typical bond thickness is about 25 to 50 microns and will be reduced to around half that in the future. As mentioned above, multiple chips may be attached to a common wiring substrate (first level package) and have a common thermal spreader, or package cap. It is desirable to use a common thermal spreader, or package cap, to minimize the number of parts and simplify the package assembly. When multiple chips are attached face down to a common wiring substrate made from a ceramic material with micro solder balls (C4's), the typical chip to chip height variation is about +/−20 microns.

Edwards, U.S. Pat. No. 5,757,620, is directed at customizing the cooling of different chips on a MCM by varying the depth of thermal compound filled gaps, or blind holes that are above each chip. The cap is typically metallic or ceramic, a plurality of semiconductor elements such as chips are secured to a substrate or module via a plurality of solder connections, and customized thermal contact areas are formed and are different for their corresponding chips and the thermal paste filled customized thermal contact areas provide a heat or thermal transfer path between the corresponding chips and the heat sink.

Sherif et al., U.S. Pat. No. 5,623,394, is directed at customizing the cooling of different chips on a MCM by using a plurality of thermally conductive materials. The heat sink or cap has a plurality of extensions or partitions that form uniform cavities or blind holes. The thermally conductive paste or grease fills the uniform cavity and provides the heat or thermal transfer path from the chips to the heat sink or cap where the appropriate thermally conductive material is placed between the chip and the thermal cap. Thermal paste or compounds could be thermal materials having a higher or lower thermal conductivity, or could have any thermal conductivity in between. Both of the above references require complicated structures to be formed on the cap or thermal spreader above each chip and use thermal pastes.

Patel, U.S. Pat. No. 5,587,882, is directed at a referencing scheme which provides an improved thermal interface between a heat sink and a specific chip within a multichip module by forming a pedestal, which is aligned with the chip, on the bottom surface of the heat sink. Selective referencing is provided where a chip, mounted on a substrate has a higher power density than other chips and selective referencing ensures that the chip will have the lowest thermal resistance at the heat sink to chip interface. To selectively reference the chip, a pedestal is formed on the heat sink in the region corresponding to the location of the chip, enabling a thermal transfer medium between the chip and the heat sink to be thinner than the thicker thermal transfer medium between the other chips and the heat sink. The above requires complicated support ring and pedestal structures to be formed on the cap or thermal spreader which is difficult, or very expensive, to form with diamond or Si—SiC composites or SiC.

Notwithstanding the prior art there remains a need to reduce the silicon substrate thickness of the lower power density chips, such as memory, mounted on a common wiring substrate with a high power density chip, or chip which requires a lower total thermal resistance, such as a processor, so that when a thermal heat spreader made of a hard, brittle, low thermal expansion and high thermal conductivity material with a polished bottom surface, such as diamond, Si—SiC composite, or SiC is rigidly bonded onto the back surface of the chips mounted on the common wiring substrate, the high power density chip has the lowest thermal resistance to the thermal spreader.

With materials such as diamond, Si—SiC composite or SiC, or composites containing particles of these materials, the cost of a thermal spreader or lid where a pedestal is formed results in a very large cost increase due to the difficulty in machining such hard and brittle materials. Wafer thinning, by grinding and/or polishing, is a standard semiconductor manufacturing process and adds only minimal cost to each chip when done at the wafer level. The amount of material removed from the wafer containing the low power density chips is adjusted to ensure that the high power density chip projects farthest above the wiring substrate than the low power density chip(s). This enables the use of diamond, SiSiC, SiC, or similar thermal spreaders with planar bottom surfaces to be used with a combination of high and low power density chips on a common wiring substrate with a simple and effective packaging structure.

Additional features and advantages are realized through the techniques of the present invention. Other embodiments and aspects of the invention are described in detail herein and are considered a part of the claimed invention. These and other purposes of the present invention will become more apparent after referring to the following description considered in conjunction with the accompanying drawings.

SUMMARY OF INVENTION

The present invention discloses an electronic packaging structure comprising a chip carrier with at least two or more semiconductor devices attached face down to the chip carrier, where at least one of the semiconductor devices will have a different thickness than the others corresponding to different power densities or different required thermal resistances between the semiconductor devices.

The electronic packaging structure further comprises a heat spreader having a substantially planar surface in thermal contact with the back (inactive) surface of the semiconductor devices; and a thermal adhesive layer in contact with the heat spreader and the semiconductor devices whereby a thinner thermal adhesive layer on the thicker semiconductor device provides a lower thermal resistance and the thicker thermal adhesive layer on the thinner semiconductor device provides a higher thermal resistance.

The chip carrier may be of any material, such as a ceramic chip carrier or an organic chip carrier. The semiconductor devices may be any electronic devices requiring thermal management such as integrated circuit chips, capacitors, resistors and thermistors. The heat spreader may be made of any appropriate material such as diamond, Si, SiC, Mo and ceramic, or composites containing these materials. The thermal adhesive layer may be any suitable thermal material such as Ag filled epoxy, filled thermoplastic, filled polymer, filled polymer adhesive, metal, and solder. Also, a common thermal adhesive layer may be applied on all the chips, or alternatively, different thermal adhesive materials may be used for different semiconductor devices with different thicknesses or thermal requirements.

In another embodiment of the invention a compliant thermal adhesive layer material is used on a lower power density semiconductor device and a rigid thermal adhesive layer material is used on a high power density device. The heat spreader may be the cap or lid of the package and a heat sink may be subsequently attached to heat spreader.

In another aspect of the invention there is disclosed a method for cooling multiple semiconductor devices with different cooling requirements on a common chip carrier with a common lid or heat spreader comprising the steps of providing a chip carrier; attaching semiconductor devices to the chip carrier where at least one of the semiconductor devices has a different thickness; placing a heat spreader having a substantially planar surface in thermal contact with the semiconductor devices; and placing a thermal adhesive layer in contact with the heat spreader and with the semiconductor devices whereby a semiconductor device requiring a lower thermal resistance has a thinner thermal adhesive layer than a semiconductor device which can tolerate a higher thermal resistance.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may be best be understood by reference to the detailed description which follows taken in conjunction with the accompanying drawings in which:

FIG. 1 is a schematic cross section illustrating a lower power density chip which has been thinned on a common wiring substrate with a higher power density chip with a common heat spreader.

FIG. 2 is a schematic cross section illustrating the use of a different thermal adhesive layer for different chip requirements.

FIG. 3 is a schematic cross section illustrating the use of both a compliant and a rigid thermal adhesive layer.

DETAILED DESCRIPTION

In a first embodiment of the invention, the lower power density devices which will be mounted on a common wiring substrate or chip carrier (first level package) and share a thermal spreader with a higher power density device, or a device which requires a lower total thermal resistance, are thinned, preferably at the wafer level, to insure that after all the devices are mounted onto the common wiring substrate, the higher power density device will project above all lower power density devices. As previously mentioned, when multiple devices are attached face down to a common wiring substrate, such as with solder balls (C4's), the typical device to device height variation is about +/−20 microns, though will of course vary depending on the type of wiring substrate used, the type of electrical attachment to the wiring substrate, the initial specifications on the wafers, and the wafer processing.

As an example, if the +/−20 micron variation mentioned above is a one sigma value, to ensure that the higher power density device is highest in the vast majority of cases (three sigma, or about 95% of the time), then the wafers containing the lower power density devices should nominally be thinned by about 120 microns relative to the wafers containing the high power devices.

Referring to FIG. 1 there is shown a first level package wiring substrate 10 to which are electrically attached by solder balls 20 (i.e. C4's) a high power density chip 30 and a low power density chip 40. The back (non-active) surface 31,41 of the chips are thermally joined to a common heat spreader 50 with a planar lower surface 51 which is made of a material with a high thermal conductivity and a thermal expansion coefficient similar to that of the semiconductor chip, such as diamond, Si, SiSiC, or SiC, or composites containing these materials. The lower power density chip 40 has been thinned to insure that the higher power density chip 30 projects above it on the packaging substrate 10 so that when the thermal spreader 50 is attached, the thickness of the thermal adhesive layer 60, such as a Ag filled epoxy, filled polymer, or metal, or solder, is substantially thinner over the higher power density chip 30 compared to over the lower power density chip 40. Note that a heat sink, or cooling plate, would typically be attached to the thermal spreader using a compliant thermal interface material (not shown in FIG. 1).

It will be understood by one skilled in the art that the chip requiring the lowest thermal resistance to the heat sink, or cooling plate, could not only be the higher power density chip, but it could also be a chip requiring a lower operating temperature, or a chip having a hot spot with a very high local power density, but a low total power density. In general the semiconductor device to be thinned will be the device which can tolerate a higher thermal resistance and the thicker device will require the lower thermal resistance.

Referring now to FIG. 2 there is shown another embodiment of the present invention. A different thermal adhesive material or metal or solder 70 is used for joining the lower power density chip 40 to the thermal spreader 50 than is used for joining the higher power density chip 30. For example, the higher power density chip 30 maybe joined to the thermal spreader 50 using a solder 80 and the lower power density chips 40 may be joined to the thermal spreader 50 using a filled polymer material 70.

Referring now to FIG. 3 there is shown another embodiment of the invention. A compliant thermal interface material 90 is used between the lower power density chip(s) 40 and the thermal spreader 50 and the higher power density chip 30 is rigidly bonded to the thermal spreader 50 using a thermal adhesive or solder material 100. This solution maybe desirable when the material of the wiring substrate 10 (first level package) has a substantially different thermal expansion coefficient than the materials of the chips and the thermal spreader as may occur with some organic wiring substrates.

Note that although only the case of having one chip with a higher power density, or which requires a lower total thermal resistance, has been described, the methods described above are also applicable when multiple higher power density chips are mounted on a common wiring substrate and share a common thermal spreader with multiple lower power density chips, although the ability to form a very thin layer of the thermal adhesive or metal or solder will be reduced due to the height variations of the multiple higher power density chips, but it will still be improved over the case where the lower power density chips are not thinned.

It will be apparent to those skilled in the art having regard to this disclosure that other modifications of this invention beyond those embodiments specifically described here may be made without departing from the scope of the invention. Accordingly, such modifications are considered within the scope of the invention as limited solely by the appended claims.

The invention claimed is:

1. An electronic packaging structure comprising:
   a chip carrier;
   at least two semiconductor devices attached to said chip carrier, where at least one of said at least two semiconductor devices is a lower power density device and at least one of said at least two semiconductor devices is a higher power density device and said lower power density device has a reduced thickness than the thickness of said higher power density device;
   a heat spreader having a substantially planar surface in thermal contact with said at least two semiconductor devices; and
   a thermal adhesive layer in contact with said heat spreader and with said at least two semiconductor devices whereby a semiconductor device requiring a lower thermal resistance has a thinner thermal adhesive layer than a semiconductor device which can tolerate a higher thermal resistance.

2. The packaging structure of claim 1 wherein said chip carrier is a ceramic chip carrier.

3. The packaging structure of claim 1 wherein said chip carrier is an organic chip carrier.

4. The packaging structure of claim 1 wherein said semiconductor devices are selected from the group consisting of integrated circuit chips, capacitors, resistors and thermistors.

5. The packaging structure of claim 1 wherein said heat spreader is comprised of material selected from the group consisting of diamond, Si, SiC, Mo, ceramic and composites containing these materials.

6. The packaging structure of claim 1 wherein said thermal adhesive layer is comprised of a material selected from the group consisting of Ag filled epoxy, filled thermoplastic, filled polymer, filled polymer adhesive, metal and solder.

7. The packaging structure of claim 1 wherein a different thermal adhesive layer is used for a semiconductor device which has a different thickness.

8. The packaging structure of claim 1 wherein said at least two semiconductor devices comprise at least one high power density semiconductor device and at least one low power density device and a compliant thermal adhesive layer material is used on said lower power density semiconductor device and a rigid thermal adhesive layer material is used on said high power density device.

9. The packaging structure of claim 1 wherein said heat spreader is the package lid.

10. The packaging structure of claim 1 wherein said lower power density device is approximately 120 microns thinner than said higher power density device.

11. A method for cooling multiple semiconductor devices with different cooling requirements on a common chip carrier with a common lid or heat spreader comprising the steps of:

providing a chip carrier;

attaching at least two semiconductor devices to said chip carrier, where at least one of said at least two semiconductor devices is a lower power density device and at least one of said at least two semiconductor devices is a higher power density device and said lower power density device has a reduced thickness than the thickness of said higher power density device;

placing a heat spreader having a substantially planar surface in thermal contact with said at least two semiconductor devices; and placing a thermal adhesive layer in contact with said heat spreader and with said at least two semiconductor devices whereby a semiconductor device requiring a lower thermal resistance has a thinner thermal adhesive layer than a semiconductor device which can tolerate a higher thermal resistance.

12. The method of claim 11 wherein a different thermal adhesive layer is used for a different semiconductor device thickness.

13. The method of claim 11 wherein said at least two semiconductor devices comprise at least one high power density semiconductor device and at least one low power density device and a compliant thermal adhesive layer material is used on said lower power density semiconductor device and a rigid thermal adhesive layer material is used on said high power density device.

* * * * *